US012762322B2

(12) United States Patent
Rathi et al.

(10) Patent No.: US 12,762,322 B2
(45) Date of Patent: Oct. 13, 2026

(54) TEMPORAL CONTROL OF FAULT FUNCTIONAL VERIFICATION

(71) Applicant: Synopsys, Inc., Sunnyvale, CA (US)

(72) Inventors: Vishal Omprakash Rathi, Sunnyvale, CA (US); Harish Kumar Chaudhry, Cupertino, CA (US); Jatinder Singh Goraya, Nashua, NH (US)

(73) Assignee: Synopsys, Inc., Sunnyvale, CA (US)

( * ) Notice: Subject to any disclaimer, the term of this patent is extended or adjusted under 35 U.S.C. 154(b) by 644 days.

(21) Appl. No.: 18/452,447

(22) Filed: Aug. 18, 2023

(65) Prior Publication Data

US 2025/0061263 A1 Feb. 20, 2025

(51) Int. Cl.
*G06F 30/398* (2020.01)

(52) U.S. Cl.
CPC .................................. *G06F 30/398* (2020.01)

(58) Field of Classification Search
CPC .... G06F 30/398; G06F 30/3323; G06F 30/33; G06F 30/337; G01R 31/31725; G01R 31/3177; G01R 31/318594
See application file for complete search history.

(56) References Cited

U.S. PATENT DOCUMENTS

| | | | | |
|---|---|---|---|---|
| 11,175,340 | B1 * | 11/2021 | Srivastava | G01R 31/31701 |
| 2016/0125110 | A1 * | 5/2016 | Mariani | G06F 30/33 703/14 |
| 2020/0117766 | A1 * | 4/2020 | Schumann | G01R 31/31704 |
| 2021/0326506 | A1 * | 10/2021 | Bhattacharya | G06F 30/367 |
| 2022/0180003 | A1 * | 6/2022 | Tehranipoor | G06F 30/337 |
| 2022/0414306 | A1 * | 12/2022 | Strasser | G01R 31/318314 |

* cited by examiner

*Primary Examiner* — Nha T Nguyen
(74) *Attorney, Agent, or Firm* — WOMBLE BOND DICKINSON (US) LLP

(57) ABSTRACT

A system and method for temporal control of fault functional verification. In some embodiments, a method includes: determining, in a nominal functional verification of a circuit, that an output of a first component has a first value at a first point in time, the output of the first component being connected to an input of a second component by a wire; determining, in a fault functional verification of the circuit, that the output of the first component has a second value, different from the first value, at the first point in time; determining, based on runtime input, that the wire passes through a barrier; and setting, in the fault functional verification, the value of the input of the second component, at the first point in time, to the first value.

20 Claims, 4 Drawing Sheets

TEMPORAL CONTROL OF FAULT FUNCTIONAL VERIFICATION

TECHNICAL FIELD

The present disclosure relates to functional verification of digital circuits.

BACKGROUND

In the design of digital circuits, functional verifications may be performed to determine whether the circuit will perform as required once fabricated. Such functional verifications may include fault functional verifications, in which the effects of various kinds of faults may be simulated.

SUMMARY

According to an embodiment of the present disclosure, there is provided a method including: determining, in a nominal functional verification of a circuit, that an output of a first component has a first value at a first point in time, the output of the first component being connected to an input of a second component by a wire; determining, in a fault functional verification of the circuit, that the output of the first component has a second value, different from the first value, at the first point in time; determining, based on runtime input, that the wire passes through a barrier; and setting, in the fault functional verification, the value of the input of the second component, at the first point in time, to the first value.

In some embodiments, the barrier is a barrier around a first design unit, the first design unit containing the first component.

In some embodiments: the first design unit is contained in a second design unit, the second design unit being one level higher in a design hierarchy, and the barrier is inherited, by the first design unit, from the second design unit.

In some embodiments, the method further includes: determining that the first point in time falls within a first time interval, the first time interval being a time interval during which the barrier is enabled, wherein the setting of the value of the input of the second component includes setting the value of the input of the second component based on the determining that the first point in time falls within the first time interval.

In some embodiments, the method further includes: determining that the second value is associated with a first fault; and determining that the barrier is associated with the first fault, wherein the setting of the value of the input of the second component, includes setting the value of the input of the second component based on: the determining that the second value is associated with the first fault, and the determining that the barrier is associated with the first fault.

In some embodiments, the method further includes: determining that the second value is associated with a fault of a first fault type; and determining that the barrier is associated with the first fault type, wherein the setting of the value of the input of the second component, includes setting the value of the input of the second component based on: the determining that the second value is associated with a fault of the first fault type, and the determining that the barrier is associated with the first fault type.

According to an embodiment of the present disclosure, there is provided a system, including: a processing circuit; and a non-transitory computer-readable medium, connected to the processing circuit, the non-transitory computer-readable medium storing instructions that, when executed by the processing circuit, cause the processing circuit to perform a method, the method including: determining, in a nominal functional verification of a circuit, that an output of a first component has a first value at a first point in time, the output of the first component being connected to an input of a second component by a wire; determining, in a fault functional verification of the circuit, that the output of the first component has a second value, different from the first value, at the first point in time; determining that the wire passes through a barrier; determining that the second value is associated with a fault of a first fault type; determining that the barrier is associated with the first fault type; and setting, in the fault functional verification, the value of the input of the second component, at the first point in time, to the first value based on: the determining that the second value is associated with a fault of the first fault type, and the determining that the barrier is associated with the first fault type.

In some embodiments, the barrier is a barrier around a first design unit, the first design unit containing the first component.

In some embodiments: the first design unit is contained in a second design unit, the second design unit being one level higher in a design hierarchy, and the barrier is inherited, by the first design unit, from the second design unit.

In some embodiments, the determining that the wire passes through the barrier includes determining, based on runtime input, that the wire passes through the barrier.

In some embodiments, the method further includes: determining that the first point in time falls within a first time interval, the first time interval being a time interval during which the barrier is enabled, wherein the setting of the value of the input of the second component, includes setting the value of the input of the second component based on the determining that the first point in time falls within the first time interval.

In some embodiments, the method further includes: determining that the second value is associated with a first fault; and determining that the barrier is associated with the first fault, wherein the setting of the value of the input of the second component, includes setting the value of the input of the second component based on: the determining that the second value is associated with the first fault, and the determining that the barrier is associated with the first fault.

In some embodiments, the determining that the wire passes through the barrier includes determining, based on runtime input, that the wire passes through the barrier.

According to an embodiment of the present disclosure, there is provided a system, including: a processing circuit; and a memory, connected to the processing circuit, the memory storing instructions that, when executed by the processing circuit, cause the processing circuit to perform a method, the method including: determining, in a nominal functional verification of a circuit, that an output of a first component has a first value at a first point in time, the output of the first component being connected to an input of a second component by a wire; determining, in a fault functional verification of the circuit, that the output of the first component has a second value, different from the first value, at the first point in time; determining, based on runtime input, that the wire passes through a barrier; and setting, in the fault functional verification, the value of the input of the second component, at the first point in time, to the first value.

In some embodiments, the barrier is a barrier around a first design unit, the first design unit containing the first component.

In some embodiments: the first design unit is contained in a second design unit, the second design unit being one level higher in a design hierarchy, and the barrier is inherited, by the first design unit, from the second design unit.

In some embodiments, the method further includes: determining that the first point in time falls within a first time interval, the first time interval being a time interval during which the barrier is enabled, wherein the setting of the value of the input of the second component includes setting the value of the input of the second component based on the determining that the first point in time falls within the first time interval.

In some embodiments, the method further includes: determining that the second value is associated with a first fault; and determining that the barrier is associated with the first fault, wherein the setting of the value of the input of the second component, includes setting the value of the input of the second component based on: the determining that the second value is associated with the first fault, and the determining that the barrier is associated with the first fault.

In some embodiments, the method further includes: determining that the second value is associated with a fault of a first fault type; and determining that the barrier is associated with the first fault type, wherein the setting of the value of the input of the second component, includes setting the value of the input of the second component based on: the determining that the second value is associated with a fault of the first fault type, and the determining that the barrier is associated with the first fault type.

In some embodiments, the barrier is a barrier around a first design unit, the first design unit containing the first component.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
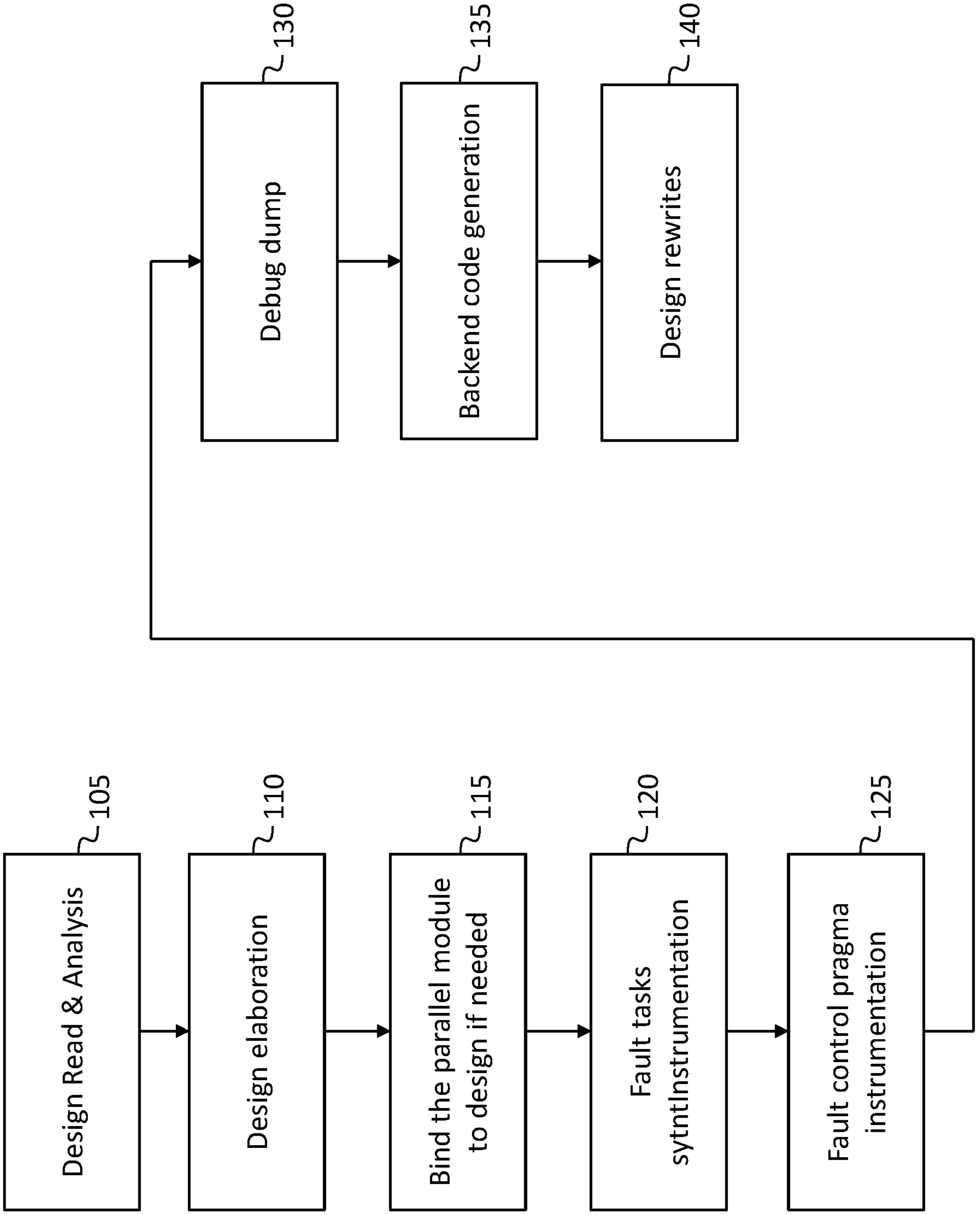
FIG. 1 is a flow chart of a compile flow, in accordance with some embodiments of the present disclosure.

Aspects of the present disclosure relate to temporal control at runtime of fault functional verifications.

In a computer system running software for performing functional verification of digital circuits, functional verifications of faults may be performed by simultaneously executing two functional verifications, which may be referred to as a good machine (GM) functional verification (or as a "nominal" functional verification) and a fault functional verification, respectively. The fault functional verification may be a functional verification of the digital circuit modified to introduce artificial faults, such as conductors, intended to be separate, that have become shorted together as a result of a manufacturing defect. The good machine functional verification is a similar functional verification without the introduction of artificial faults. It may be advantageous to limit the extent within the circuit over which the signals of the fault functional verification propagate; this may be accomplished using a feature referred to as a barrier. Each barrier may apply to one or more conductors (or wires) in the circuit; when a barrier applies to a conductor, the inputs (of components of the circuit) to which signals are fed by the conductor are fed the value produced by the good machine functional verification (regardless of whether this value is the same as the value of the fault functional verification for the conductor). In some functional verifiers (or simulators), such barriers are specified only at compile time; as a result, to change the barriers, it may be necessary to recompile the design. This may be burdensome and time-consuming, especially for large circuits.

As such, in some embodiments, a functional verifier is configured to be capable of modifying barriers at run time. For example, the functional verifier may receive a command, in a Unified Command Line Interface (UCLI) file, to set up a barrier at a first point in time in the functional verification, and to remove the barrier at a second point in time. Such a feature may be useful, for example, for avoiding the propagation across the circuit of circuit conditions, at startup or at reset that, during normal operation, would be anomalous and considered faults. As another example, a barrier may be created, at run time, that operates as a barrier only to certain kinds of faults (e.g., to transient faults) or to particular faults (each of which may be identified by a respective fault identifier).

Technical advantages and technical benefits of the present disclosure include, but are not limited to, streamlining the functional verification of faults, which may improve the functionality of a computer system performing functional verification according to some embodiments. Some embodiments make it possible to run a fault functional verification with a first set of barriers, and to then run a second fault functional verification, with a different set of barriers, without recompiling the design. This may make it possible to systematically pursue an understanding of undesired circuit behavior (manifested for example, in the first fault functional verification), without incurring the burden (on the user and on the system) of recompiling the design before performing the second fault functional verification, and thereby to improve the functionality of the computer system running the functional verifications. Some embodiments make it possible to configure one or more barriers so that certain faults are stopped at the barriers while other faults propagate through the barriers. This may make it possible to generate additional information regarding faults that are of particular interest in a fault functional verification without potentially also generating large volumes of data related to faults that are of relatively little interest.

Fault functional verification is the process of simulating the effect of a fault or malfunction in a digital circuit. This is used to evaluate the reliability of a complex circuit and ability of the system to react to a fault in the design in the event of failures. Fault functional verification plays a critical role in the domain of automotive circuits, where safety is paramount.

Fault functional verification tests have an additional requirement over design verification tests. In a fault functional verification, the user may specify at which input/output (I/O) pins the fault is to be observed (by the functional verifier), and during which interval of time the fault should be observed (by the functional verifier). There may be a delay because there are finite windows of time when the functional verification will be capturing data to compare against desired good circuit behavior. If the fault functional verifier were allowed to always observe, it would unrealistically detect faults that only briefly affect observation points.

Model based fault injection may be used to quantify the number of faults within a design that may cause the failure of a device such that it violates a safety goal or the ability of the safety mechanism(s) to correct, react, or signal the violation of a safety goal. Faults are injected and the result of the functional verification is specific to the workload provided. This workload may include application code, software test libraries, diagnostics, or even functional test patterns. Failures during the operation of the device may range from an open (broken wire), or simple shorts, to complex behavior. Different fault models closely reflect the different defects. Some software offers several models as identified in the International Standards Organization (ISO)-26262:2011 standard. The immediate result of a fault injection is a report of the number and percentage of faults that are detected by a workload or a set of workloads. In a verification environment, fault functional verification identifies areas of the design that are not yet tested and that need test improvements. This information may be used to improve the quality of both the workloads and the safety mechanisms.

Workload validation helps to (i) determine the quality of the workloads by determining the faults detected by each test, (ii) determine areas of the design that require additional or modified workloads, and (iii) find tests that improve the quality of the test suite.

Fault functional verification, in some instances, may detect areas of low testability due to design flaws. If functional tests do not cause observable behavior in a portion of the chip during fault functional verification, there may be a design problem in that part of the chip.

Fault injection tests have an additional requirement over design verification tests. For fault functional verification, where and when the functional verifier should observe the fault may be defined. This includes observing where the fault may cause a device failure and when and where the safety mechanism(s) may detect the failure.

One embodiment is a computer-implemented method for validation fault functional verification in which fault flows throughout the design and at times a user may require that fault propagation inside certain part of the design or hierarchy at a particular functional verification time be disabled. For example, when the system is under reset and system may be in corrupted state, propagating fault during such time may result in false detects as it may be an acceptable state when system is just coming out of reset. Faults may be propagating through the portion of the design where supposedly there is no need of fault functional verification during that phase of the design.

Related art functional verification systems only provide compile time static pragmas, such as 'begin_faultfree 'end_faultfree, encapsulating the hierarchy of the design where faults are allowed. Another option is 'begin_faultprevent 'end_faultprevent wherein the fault is not allowed to be propagated. These are all compile time directives and may not be switched back and forth during the functional verification as per design needs.

Compile time pragmas are restrictive wherein changing the scope of the fault functional verification always requires the recompilation and functional verification which may incur significant turnaround in case of large system on a chip (SOC) designs. Related art functional verification systems may not provide a method to control a particular fault type for a particular area of the design, and all types of faults may be impacted by compile time exclusion. The following is a list of various fault models as defined in ISO-26262:

- Stuck-at faults, which are s@0 and s@1 faults (corresponding to conductors that are stuck at logical zero or logical one, respectively) on primitive input and output terminals, module ports and nets, registers, arrays, continuous assigns, and expressions
- Transition faults, which are slow-to-rise and slow-to-fall faults on primitive input and output terminals and module ports
- Bridge faults, which are wire, wand, wor, X-dominant and Y-dominant faults between any two nets
- IDDQ (quiescent power supply current) Faults, which are pseudo stuck-at, toggle and neighborhood bridge faults
- Expression faults, which are faults injected in the expressions within procedural code
- Transient faults, which are faults that occur once and then disappear Some embodiments relate to providing dynamic control techniques for fault functional verification in electronic design automation. Fault functional verification is critical in evaluating the reliability of a complex circuit, especially in the automotive domain, where safety is paramount. Some embodiments provide a system call that enables users to control the scope of fault propagation and its effect at various functional verification times during the design validation cycle. The method also allows users to control the types of fault for a specific part of the design. Related art solutions provide compile-time directives that may not be switched during functional verification, leading to the recompilation and functional verification of large SOC designs. Some embodiments aim to solve these limitations and provide more flexibility and efficiency in fault functional verification. In some embodiments, the system couples the circuit design with a fault control task, so that the type of fault and scope of fault functional verification can be controlled.

The approach of defining a new system call which may be executed at runtime attempts to solve all the limitations of the existing way to control fault propagation. This approach attempts to enable the user to control the scope of fault propagation and its effect in the design at various functional verification times in the design validation cycle.

Some embodiments also enable user to control the types of the fault for select specified parts of the design, give the user unlimited ways to configure the fault functional verification validation, and give the user the ability to utilize the power fault functional verification to the greatest possible extent.

A user may use the control system task call (which may be referred to as $faultcontrol( . . . )) at different time intervals to control the fault effect in certain regions. $faultcontrol may handle a variety of combinations of fault classes, fault identifiers (IDs), level and list of instances.

Listed below are a number of different use cases in which some embodiments may provide benefit.

A first category of use cases is preventing irrelevant fault propagation: Using $faultcontrol to enhance SOC testing during certain phase. This category includes the following use cases:

- The design may undergo a reset phase or multiple functional modes after fault injection, potentially resulting in an unstable good machine (GM) state.

- Fault functional verification detection may not be necessary or significant during such a phase or in such functional modes.
- Isolating fault to a certain part of design from test to test, as focus area of design verification may vary from test to test depending on stimulus.
- The $faultcontrol feature may be used to intentionally disable the propagation of faults during certain phases of the design, such as the reset phase/functional mode.
- Once the reset phase is complete, $faultcontrol may be re-enabled to allow the design to run for faults.

This approach may ensure that fault functional verification is performed when it is most needed and may improve the accuracy of fault detection.

A second category of use cases is selective fault propagation: maximizing testing efficiency and accuracy during certain phases. This category includes the following use cases:

- During the reset phase, certain types of faults, such as stuck-at faults, may not be relevant, while other types of faults, like transition faults, may still be important to detect.
- The $faultcontrol feature may be used to intentionally disable the propagation of certain types of faults during the reset phase.
- Once the reset phase is complete, $faultcontrol may be re-enabled to allow the detection of the desired types of faults.

A third category of use cases is selective fault propagation: restricting the scope of certain features. This category includes the following use cases:

- The $faultcontrol feature enables selective use of certain technologies in a design for fault functional verification.
- Uses of the $faultcontrol feature to restrict fault functional verification for assertions to a subset of the design for fault propagation.

A fourth category of use cases is ease of debugging and performance. This category includes the following use cases:

- The $faultcontrol feature may be used during fault functional verification to limit the scope of fault propagation, making it easier to debug faults in specific areas of the design.
- This approach may reduce the size of the fm fault dump (fsdb file) and speed up the process of identifying divergent faults.
- By restricting the effect of fault on parts of a design, a user may be able to speed up the fault functional verification.

A fifth category of use cases is dynamic fault control: flexible and efficient fault propagation management for complex SOC testing. This category includes the following use cases:

- In a complex SOC, there may be parts of the Intellectual Property (IP) that an integrator may disable to prevent faults from affecting the test results.
- During testing, only certain parts of the design may need to be tested, and the scope of testing may vary from test to test.
- The dynamic $faultcontrol feature may be used to control the propagation of faults during functional verification, offering greater flexibility without requiring the design to be recompiled.
- By enabling integrators to selectively disable certain parts of the design during testing, this approach may help to reduce the number of irrelevant faults that are detected, improving the efficiency and accuracy of the testing process. The process may also involve controlling the classes of faults for certain scopes.

A sixth category of use cases is dynamic fault control: controlling the classes of faults. This category includes the following use cases:

- In a design the $faultcontrol call may be used to control certain classes of faults to a particular hierarchy.
- For example, a transition/transient fault may be a good fit for certain modules and not for other modules; the user may control the specific fault class for scopes.

In summary, some embodiments provide improved fault functional verification method with selective control of fault scope and instances. Some embodiments involve coupling a design with a fault control task to control the scope of instances and type of faults for effective fault functional verification. Some embodiments enable selection of fault type, instance, and functional verification period to perform verification of the design with the ability to enable or disable fault functional verification effect. Fault control tasks may be added dynamically at runtime via a Unified Command Line Interface (UCLI) file or via a separate module bind without the need to modify the design. Different hierarchies with different fault types may coexist in the fault functional verification environment during a functional verification period. The method may be easily integrated into some functional verification tools. The advantages of some embodiments include the ability to control fault impact at specific times, and to select certain faults to be simulated at different phases of the design, all without the need to modify the design.

Effective fault functional verification of designs has been a challenge for many years. Verifying the intent of the design using fault functional verification is not straightforward because there may be a disconnect between the register transfer level (RTL) and fault scope objects. Users may be unable to access and manipulate the fault functional verification scopes in the same way as they do for generating or placing the faults. Various tool-generated fault functional verification points allow waiver of faults propagation at compile time. Often these tool-generated waivers do not suffice for the user's needs and there is a requirement for an additional way to control the fault effects at run time. Users have also adopted various approaches to waive certain faults via manipulating fault statuses to keep the fault alive beyond the detection point, by either downgrading the fault or changing the status using various existing system tasks.

In some related art fault functional verification tools, there is a provision to permanently shut off directed scopes of design fault functional verification during functional verification using design pragmas such as 'begin_faultfree and 'end_faultfree which restrict the fault to a given scope, and 'begin_faultprevent and 'end_faultprevent which restrict the fault to not propagate inside the scope. However, these provisions does not offer the flexibility to control the individual scope during a functional verification. Another way to not control the fault propagation but instead to stop dropping the fault at detection points is converting the fault to a different status using a fault definition file or using runtime switches. Runtime switches based on features such as max-pot may be nondeterministic as they may be controlled only on the number of detects to be avoided. The number of detections may be different for different tests and may depend on each individual functional verification path taken by each test.

In each of these approaches the user may be required to use these techniques at compile time, because the controls are included as a part of the design, thus restricting the user's ability to experiment. As such, changing the controls may involve recompilation of the design, and for large SOC designs such a recompilation may take multiple hours. Thus, some related art methods severely restrict the user's ability to experiment with the design, and limit the scope of fault functional verification. Changing the scope and re-spinning the design may be a long, arduous task. Even a simple task such as adding more pragmas may involve re-iteration of the whole fault functional verification flow, which is highly time inefficient especially when the functional verifications are run for larger systems-on-chips (SOCs).

The present disclosure relates to a method and system for performing an effective fault functional verification by selectively enabling or disabling portions of the hierarchy of the design. The method includes coupling the design with a fault control task which may control the scope of instances and types of faults. Using the disclosed methods, a user (e.g., a verification engineer) may select a type of a fault, an instance, or a functional verification period, and enable or disable the fault functional verification effect to perform an effective verification of the design. In one embodiment, the fault control tasks may be added using a UCLI file or a separate module, and the user may bind the module to the design to effectively develop a flow without needing to modify the design. The bind directive may be specified in a module, an interface, or a compilation unit. A fault campaign may include a variety of faults, a block level device under test (DUT), and a top level DUT under test for faults.

Advantages of some embodiments include, but are not limited to, the ability to selectively enable (or disable) a specific hierarchy at compile time. A user may selectively disable (or enable) the hierarchy of the design at runtime.

Additionally, one or more particular types of faults (e.g., stuck at or transient or transition faults) may be controlled along the design hierarchy of interest. These hierarchies may be disabled or enabled while the rest of the design hierarchy continues to simulate the faults.

Other advantages include the ability to select a type of fault hierarchy and to specify a different hierarchy with different fault types; both may co-exist in the fault functional verification environment during a functional verification period, and the user may selectively enable or disable the hierarchy to perform an effective verification of a fault functional verification. The methods and systems disclosed here may be integrated into various functional verification tools. These fault functional verification system tasks provide mechanisms for a user to control the fault propagation and its functional verification dynamically at runtime and to provide temporal control at runtime. They enable a user to experiment with controlling different types of faults for different hierarchies.

As such, some advantages of some embodiments are as follows:

A user need not modify the design; fault functional verification effects may purely be controlled (e.g., temporally controlled) at runtime.

The user may choose to control a certain time when fault impact may be suppressed, for example during design state, the GM state may not be stable and performing a fault functional verification may not make sense.

The user may choose certain faults to be simulated at certain phase of design. For example, a stuck at fault may not be a good fit during the reset phase of the design but a transient fault may make sense.

The system task ($faultcontrol) specified below may cater to all the needs of dynamic fault management for the user. The task may be defined as $fault_control_task with the arguments below.

```
$faultcontrol([levels], [control_type],[fault_type], [fault id], [ list_of_modules_or_instances]);
list_of_module_or_instances ::= module_or_instance {, module_or_instance}
module_or_instance ::= module_identifier | name_of_instance
name_of_instance ::= instance_identifier { unpacked_dimension }
unpacked_dimension ::=
[ constant_range ]
| [ constant_expression ]
module_identifier ::= identifier
instance_identifier ::= identifier
```

The values of the control_type argument are shown in the table below. This argument controls the fault type of the $faultcontrol system task. This argument may be an integer expression.

| control_type | Effect |
|---|---|
| 0 | Fault free, i.e., allow fault below specified hierarchy |
| 1 | Fault prevent, i.e., ignore fault below specified hierarchy |

The values of the fault_type argument are shown in the table below. This argument controls the fault type of the $faultcontrol system task. This argument may be an integer expression.

| fault_type | Effect |
|---|---|
| 0 | All faults types |
| 1 | Stuck-At WIRE fault |
| 2 | Stuck-At VARI fault |
| 3 | Stuck-At PORT fault |
| 4 | Stuck-At PRIM fault |
| 5 | Transient fault |
| 6 | Transition fault |
| 7 | Bridge fault |
| 8 | IDDQ fault |
| 9 | Bridge fault |
| 10 | Expression fault |
| 11 | Cell Aware fault |

The fault_id argument controls the particular fault by ID in the $faultcontrol system task. This argument may be an integer expression.

The levels argument specifies the levels of the hierarchy, consistent with the corresponding argument to the $dumpvars system task. If this argument is not specified, it may default to 0. This argument may be an integer expression.

The list_of_module_or_instances argument is one or more module_identifiers or instance_identifiers. Only modules or instances are allowed. If more than one module_identifier or instance_identifier is specified, they may be separated by a comma. Instance names to modules may be used in this argument, using the period hierarchy separator. String literals may be prohibited for the module_identifier or instance_identifier. If no scope_list value is provided, the scope may be the module from which $faultcontrol task is called.

FIG. 1 describes the compile flow (and illustrates compile time actions) for the system task $faultcontrol, which is written in a design or bound as a separate module. As illustrated in FIG. 1, in some embodiments, design read and analysis is performed at 105 ($faultcontrol tasks may be read as part of the design read); design elaboration is performed at 110; at 115, the parallel module is bound to the design if needed; at 120 fault tasks sytntInstrumentation is implemented; at 125, Fault control pragma instrumentation is implemented ($faultcontrol tasks may also be provided via $ucli calls at runtime, as system tasks calls); at 130, a debug dump is performed; at 135, backend code generation is performed ($faultcontrol may be bound as a separate module along with design passed onto the runtime); and at 140, design rewrites are performed.

Figure 2:
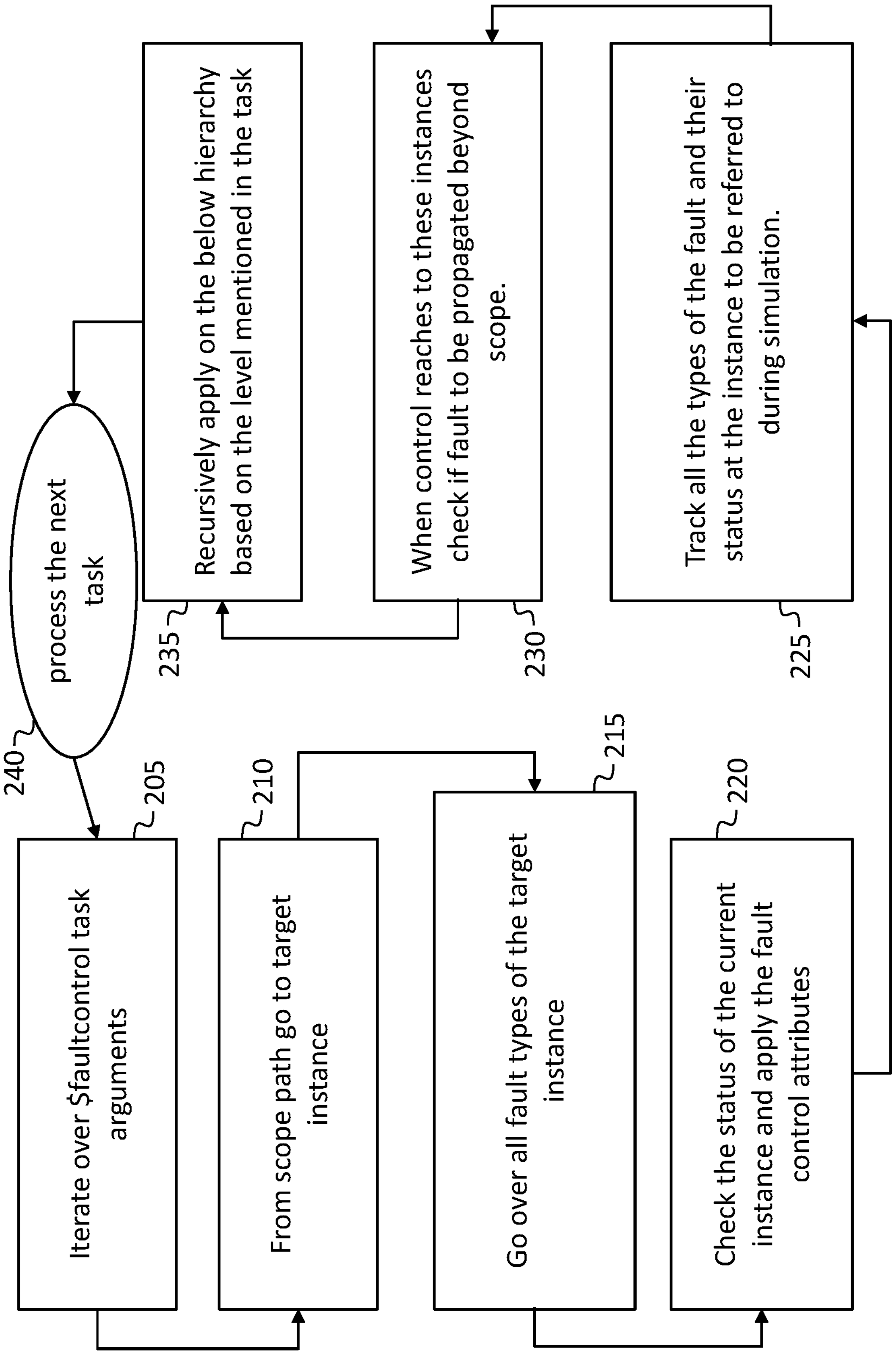
FIG. 2 is a flow chart of a runtime flow, in accordance with some embodiments of the present disclosure.

FIG. 2 describes the runtime flow of system task handling (and illustrates runtime actions). As illustrated in FIG. 2, the system may, at 205, iterate over $faultcontrol task arguments; at 210 it may go to the target instance from the scope path; at 215, it may go over all fault types of the target instance; at 220, it may check the status of the current instance and apply the fault control attributes; at 225 it may track all the types of the fault and their status at the instance to be referred to during simulation; at 230, it may, when control reaches to these instances, check if fault to be propagated is beyond the scope; and, at 235, it may recursively apply to the hierarchy below based on the level mentioned in the task. It may then proceed, at 240, to process the next task.

A call to $faultcontrol may also be triggered at run time by the inclusion of this call in the standard UCLI file supplied to the functional verification. In this case no design modification is needed.

In another embodiment, when a fault functional verification is performed on a design, the functional verification may include multiple fault types of functions of a chip, which may be partitioned via performance characteristics (e.g., one block may be high performance, while the rest of the chip may be lower performance). To achieve a goal for the high-performance block, a transient fault may be used, to validate the transient nature of the faults in the design. Other parts of the design may be better suited for different types of fault coverage, such as stuck at faults. Thus, propagation of a fault beyond certain regions may not be meaningful. As such, in some embodiments, the user may control the fault types for a particular hierarchy.

With a variety of faults in designs, there is the complication of capturing fault type and designing a waiver system for it. A typical central processing unit (CPU) system may be best suited for a particular type of fault, whereas other modules, e.g., power modules, may be better suited for other types of faults.

The system task may also be called via $ucli calls at run time, which provides the flexibility for the user to vary the scope of fault propagation from test to test, and gives some embodiments more flexibility than defined embedded system calls at compile time. This makes the flow flexible, allowing the user to completely control the fault functional verification environment at run time. This opens fault functional verification control for limitless possibilities. $ucli calls may be a method provided by the debug environment to drive or inspect the design at runtime via an interactive mode.

In dynamic power verification, several aspects may be checked. First, the design may go through a reset phase, during which the state may be conclusive and the user may desire to waive fault functional verification on some of blocks for a fault or the entire fault functional verification. Later the user may want to enable the full fault functional verification. This may make it possible to check (i) the fault detection in the right context within the design RTL, and (ii) the fault functional verification together to make sure the design is functioning properly and not flagging false negatives. Next, the type of waveforms and fault activity seen in the design may determine the dynamic nature of fault propagation and functional verification since it depends on the activity factor. The higher the activity factor, the greater the extent to which the fault effects are propagated. Hence, observing the fault in the correct phase and context may make it possible to accurately estimate the effectiveness of fault functional verification.

To avoid false positive via dynamic runtime control, a user may potentially uncover the next set of defects or faults which may have been masked because of false negatives, e.g., because of faults being detected in a non-relevant time section or hierarchy section of the design. In related art systems, realizing in a later part of the testing that faults have been masked by false negatives may have repercussion on the validation plan and may lead to a costly re-spin involving design modifications and a need to go through a full fault functional verification cycle.

Another advantage of using a runtime control task over the related art compiler-based pragma may be that it gives the user the ability to apply an exclusion without having to modify the design when a control task is triggered via the UCLI file. As, such, the user may be able to exercise temporal control at runtime.

In some circumstances, a user may be using third-party verification IPs (VIP's) or libraries which may lack the ability to change the design and, as such, may be handicapped in that they may be limited to related art exclusions. By contrast, the way in which exclusions are implemented in some embodiments may empower the user with the ability to leverage a unique runtime approach to exercise temporal control at runtime and to get around this flow limitation and may enable more avenues for validation.

In some embodiments, the fault control task with design intent may be written as an independent module and bound with the language bind construct. System Verilog provides a powerful bind construct that may be used to specify one or more instantiations of a module, interface, program, or checker without modifying the code of the target. So, for example, fault control tasks that are encapsulated in a module, interface, program, or checker may be instantiated in a target module or a module instance in a non-intrusive manner. Still, customized fault functional verification control may be kept separate, not only from the design code but also from functional environment.

A user may also leverage a partial elaboration feature to replace, at run time, the dummy module instantiated at compile time with a new body of a module which may define a set of the exclusion rules, enabling the user to change the behavior at run time.

The following examples are purely illustrative of the functioning of the above arguments in the example code for fault functional verification finer control.

Example 1: Disabling and Enabling Full Hierarchy Beneath Specified Instance

Details: At time 0, disable all instance beneath for fault which are present inside the design scope and later, at time 10, enable all instance beneath the scope tb.top.inst.

```
call {$faultcontrol(0,1,0, 0,tb.top.inst) }
run 10
call {$faultcontrol(0,0,0, 0,tb.top.inst) }
```

Example 2: Disabling with Level Control, to a Different Depth from a Given Hierarchy Details: At time 0, disable all instances to depth 3 beneath tb.top.inst for faults which are present inside the design scope tb.top.inst and then reenable at time 10 for depth 2.

```
call {$faultcontrol(3,1,0, 0,tb.top.inst) }
run 10
call {$faultcontrol(2,0,0, 0,tb.top.inst) }
```

Example 3: Controlling with Fault Type

Details: In this case port fault particular propagation is controlled under the hierarchy; in the example below it controls port fault (3) to be disabled at time 0 and enabled at time 10.

```
call {$faultcontrol(0,1,3,0,tb.top.inst) }
run 10
call {$faultcontrol(0,0,3,0,tb.top.inst) }
```

Example 4: Controlling Per Fault Id

Details: At time 0, disable all instances beneath tb.top.inst for fault ID 4 which are present inside the design scope and later re-enable the same at time 10.

```
call {$faultcontrol(0,1,0,4,tb.top.inst) }
run 10
call {$faultcontrol(0,0,0,4,tb.top.inst) }
```

Alternatively, a user may use this system to call $faultcontrol in a Verilog design file in any behavioral logic.

Example 1: Disabling and Enabling Full Hierarchy Beneath Specified Instance

Details: At time 0, disable all instance beneath for fault which are present inside the design scope and later, at time 10, enable all instance beneath the scope tb.top.inst.

```
initial begin
  $faultcontrol(0,1,0, 0,tb.top.inst);
  #10 $faultcontrol(0,0,0, 0,tb.top.inst);
end
```

Example 2: Disabling with Level Control, to a Different Depth from tb.top.inst in the Given Hierarchy Details: At time 0, disable all instances to depth 3 beneath tb.top.inst for faults which are present inside the design scope tb.top.inst and then reenable at time 10 for depth 2.

```
initial begin
  $faultcontrol(3,1,0, 0,tb.top.inst); //
  #10 $faultcontrol(2,0,0, tb.top.inst);
end
```

Example 3: Controlling with Fault Type

Details: In this case port fault particular propagation is controlled under the hierarchy; in the example below it controls port fault (3) to be disabled at time 0 and enabled at time 10.

```
initial begin
  $faultcontrol(0,1,3,0,tb.top.inst);
  #10 $faultcontrol(0,1,3,0, tb.top.inst);
end
```

Example 4: Controlling Per Fault ID

Details: At time 0, disable all instance beneath tb.top.inst for fault ID 4 which are present inside the design scope and later re-enable the same at time 10.

```
initial begin
  $faultcontrol(0,1, 0,4, tb.top.inst);
  #10 $faultcontrol(0,0,0,4,tb.top.inst);
End
```

In operation, the functional verifier of some embodiments may, as mentioned above, run a good machine functional verification of a circuit and a fault functional verification of the circuit. The circuit may include a first component and a second component, connected by a wire, which may connect an output of the first component to an input of the second component. The two functional verifications may be run concurrently. In the good machine functional verification the functional verifier may determine that an output of the first component has a first value at a first point in time, and in the fault functional verification of the circuit, the functional verifier may determine that that the output of the first component has a second value, different from the first value, at the first point in time. The functional verifier may determine, based on runtime input (e.g., based on a call to $faultcontrol enabling a barrier on the wire), that the wire passes through such a barrier; and set, in the fault functional verification, the value of the input of the second component, at the first point in time, to the first value. As used herein, "runtime" refers to points in time during the functional verification, whereas "compile time" refers to points in time during compilation of the digital circuit (e.g., from a hardware description language, such as Verilog).

In some embodiments, the barrier on the wire may, as a result of runtime input received by the functional verifier (e.g., as a result of a call to $faultcontrol) enabling a barrier on the wire for certain kinds of faults, or for certain specific faults (identified by fault ID), apply only to the certain kinds of faults, or to the certain specific faults. In some embodiments, the runtime input may identify the wires to which the barrier is to apply by specifying a design unit (e.g., in a hierarchical design specified using a hardware description language, such as Verilog) and a set of levels of the hierarchy, and the functional verifier may set up barriers on all of the wires crossing the design unit boundaries at any of the specified levels of the hierarchy. The functional verifier may maintain, for each wire in the circuit, a Boolean variable the value of which indicates whether a barrier is in place on the circuit (or one or more arrays of Boolean variables, each element of which indicates whether a barrier is in place for a respective fault, or for a respective fault type).

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It may be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It may be evident that various modifications may be made thereto without departing from the broader spirit and scope of implementations of the disclosure as set forth in the following claims. Where the disclosure refers to some elements in the singular tense, more than one element may be depicted in the figures and like elements are labeled with like numerals. The disclosure and drawings are, accordingly, to be regarded in an illustrative sense rather than a restrictive sense.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, the word "or" is inclusive, so that, for example, "A or B" means any one of (i) A, (ii) B, and (iii) A and B.

Each of the terms "processing circuit" and "means for processing" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Figure 3:
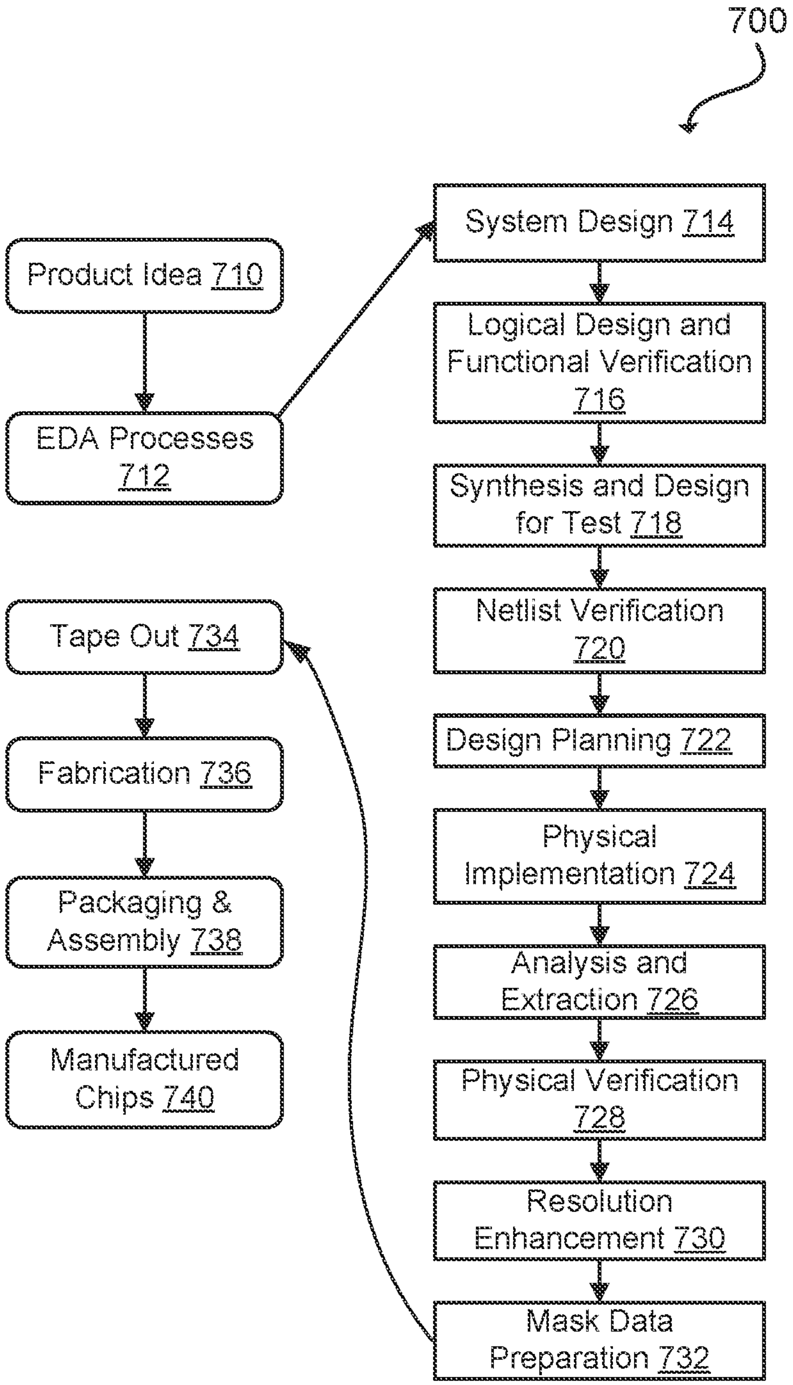
FIG. 3 depicts a flowchart of various processes used during the design and manufacture of an integrated circuit in accordance with some embodiments of the present disclosure.

FIG. 3 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 3. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use functional verifiers and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in functional verifications. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

Figure 4:
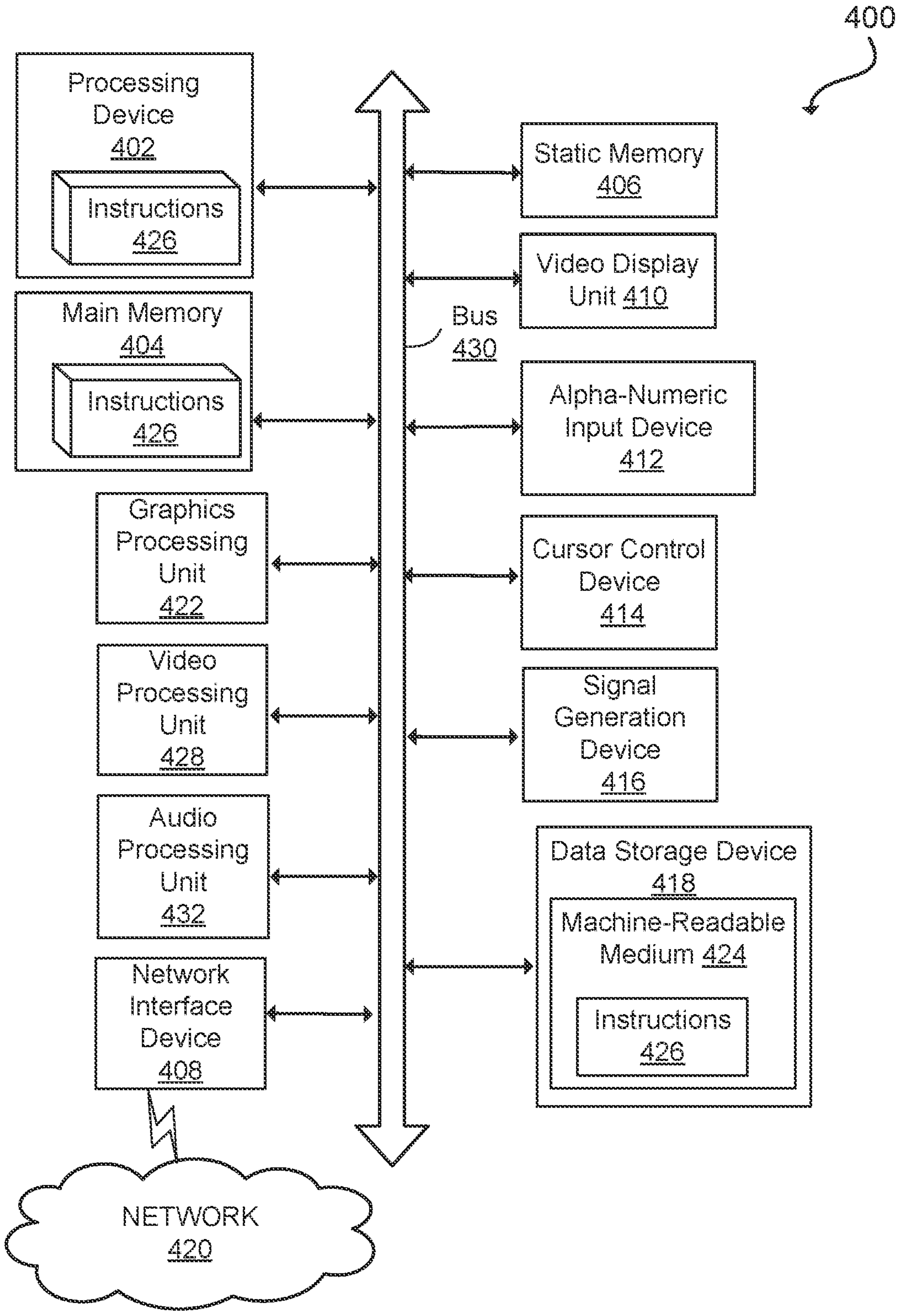
FIG. 4 depicts a diagram of an example computer system in which embodiments of the present disclosure may operate.

FIG. 4 illustrates an example machine of a computer system 400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM), a static memory 406 (e.g., flash memory, static random access memory (SRAM), etc.), and a data storage device 418, which communicate with each other via a bus 430.

Processing device 402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 may be configured to execute instructions 426 for performing the operations and steps described herein.

The computer system 400 may further include a network interface device 408 to communicate over the network 420. The computer system 400 also may include a video display unit 410 (e.g., a liquid crystal display (LCD) or a cathode ray tube (CRT)), an alphanumeric input device 412 (e.g., a keyboard), a cursor control device 414 (e.g., a mouse), a graphics processing unit 422, a signal generation device 416 (e.g., a speaker), graphics processing unit 422, video processing unit 428, and audio processing unit 432.

The data storage device 418 may include a machine-readable storage medium 424 (also known as a non-transitory computer-readable medium) on which is stored one or more sets of instructions 426 or software embodying any one or more of the methodologies or functions described herein. The instructions 426 may also reside, completely or at least partially, within the main memory 404 and/or within the processing device 402 during execution thereof by the computer system 400, the main memory 404 and the processing device 402 also constituting machine-readable storage media.

In some implementations, the instructions 426 include instructions to implement functionality corresponding to the present disclosure. While the machine-readable storage medium 424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a non-transitory computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element may be depicted in the figures and like elements are labeled with like numerals. The disclosure and drawings are, accordingly, to be regarded in an illustrative sense rather than a restrictive sense.

What is claimed is:

1. A method comprising:

determining, in a nominal functional verification of a circuit, that an output of a first component has a first value at a first point in time, the output of the first component being connected to an input of a second component by a wire;

determining, in a fault functional verification of the circuit, that the output of the first component has a second value, different from the first value, at the first point in time;

determining, based on runtime input, that the wire passes through a barrier; and setting, in the fault functional verification, the value of the input of the second component, at the first point in time, to the first value.

2. The method of claim 1, wherein the barrier is a barrier around a first design unit, the first design unit containing the first component.

3. The method of claim 2, wherein:

the first design unit is contained in a second design unit, the second design unit being one level higher in a design hierarchy, and the barrier is inherited, by the first design unit, from the second design unit.

4. The method of claim 1, further comprising:

determining that the first point in time falls within a first time interval, the first time interval being a time interval during which the barrier is enabled, wherein the setting of the value of the input of the second component comprises setting the value of the input of the second component based on the determining that the first point in time falls within the first time interval.

5. The method of claim 1, further comprising:

determining that the second value is associated with a first fault; and determining that the barrier is associated with the first fault, wherein the setting of the value of the input of the second component, comprises setting the value of the input of the second component based on:

the determining that the second value is associated with the first fault, and the determining that the barrier is associated with the first fault.

6. The method of claim 1, further comprising:

determining that the second value is associated with a fault of a first fault type; and determining that the barrier is associated with the first fault type, wherein the setting of the value of the input of the second component, comprises setting the value of the input of the second component based on:

the determining that the second value is associated with a fault of the first fault type, and the determining that the barrier is associated with the first fault type.

7. A system, comprising:

a processing circuit; and a non-transitory computer-readable medium, connected to the processing circuit, the non-transitory computer-readable medium storing instructions that, when executed by the processing circuit, cause the processing circuit to perform a method, the method comprising:

determining, in a nominal functional verification of a circuit, that an output of a first component has a first value at a first point in time, the output of the first component being connected to an input of a second component by a wire;

determining, in a fault functional verification of the circuit, that the output of the first component has a second value, different from the first value, at the first point in time;

determining that the wire passes through a barrier;

determining that the second value is associated with a fault of a first fault type;

determining that the barrier is associated with the first fault type; and setting, in the fault functional verification, the value of the input of the second component, at the first point in time, to the first value based on:

the determining that the second value is associated with a fault of the first fault type, and the determining that the barrier is associated with the first fault type.

8. The system of claim 7, wherein the barrier is a barrier around a first design unit, the first design unit containing the first component.

9. The system of claim 8, wherein:

the first design unit is contained in a second design unit, the second design unit being one level higher in a design hierarchy, and the barrier is inherited, by the first design unit, from the second design unit.

10. The system of claim 9, wherein the determining that the wire passes through the barrier comprises determining, based on runtime input, that the wire passes through the barrier.

11. The system of claim 7, wherein the method further comprises:

determining that the first point in time falls within a first time interval, the first time interval being a time interval during which the barrier is enabled, wherein the setting of the value of the input of the second component, comprises setting the value of the input of the second component based on the determining that the first point in time falls within the first time interval.

12. The system of claim 7, wherein the method further comprises:

determining that the second value is associated with a first fault; and determining that the barrier is associated with the first fault, wherein the setting of the value of the input of the second component, comprises setting the value of the input of the second component based on:

the determining that the second value is associated with the first fault, and the determining that the barrier is associated with the first fault.

13. The system of claim 12, wherein the determining that the wire passes through the barrier comprises determining, based on runtime input, that the wire passes through the barrier.

14. A system, comprising:

a processing circuit; and a memory, connected to the processing circuit, the memory storing instructions that, when executed by the processing circuit, cause the processing circuit to perform a method, the method comprising:

determining, in a nominal functional verification of a circuit, that an output of a first component has a first value at a first point in time, the output of the first component being connected to an input of a second component by a wire;

determining, in a fault functional verification of the circuit, that the output of the first component has a second value, different from the first value, at the first point in time;

determining, based on runtime input, that the wire passes through a barrier; and setting, in the fault functional verification, the value of the input of the second component, at the first point in time, to the first value.

15. The system of claim 14, wherein the barrier is a barrier around a first design unit, the first design unit containing the first component.

16. The system of claim 15, wherein:

the first design unit is contained in a second design unit, the second design unit being one level higher in a design hierarchy, and the barrier is inherited, by the first design unit, from the second design unit.

17. The system of claim 14, wherein the method further comprises:

determining that the first point in time falls within a first time interval, the first time interval being a time interval during which the barrier is enabled, wherein the setting of the value of the input of the second component comprises setting the value of the input of the second component based on the determining that the first point in time falls within the first time interval.

18. The system of claim 14, wherein the method further comprises:

determining that the second value is associated with a first fault; and determining that the barrier is associated with the first fault, wherein the setting of the value of the input of the second component, comprises setting the value of the input of the second component based on:

the determining that the second value is associated with the first fault, and the determining that the barrier is associated with the first fault.

19. The system of claim 14, wherein the method further comprises:

determining that the second value is associated with a fault of a first fault type; and determining that the barrier is associated with the first fault type, wherein the setting of the value of the input of the second component, comprises setting the value of the input of the second component based on:

the determining that the second value is associated with a fault of the first fault type, and the determining that the barrier is associated with the first fault type.

20. The system of claim 19, wherein the barrier is a barrier around a first design unit, the first design unit containing the first component.

* * * * *